(12) United States Patent
Yamanaka (10) Patent No.: US 8,772,734 B2
(45) Date of Patent: Jul. 8, 2014

(54) CHARGED PARTICLE BEAM LITHOGRAPHY APPARATUS AND METHOD, AND ARTICLE MANUFACTURING METHOD

(71) Applicant: Canon Kabushiki Kaisha, Tokyo (JP)

(72) Inventor: Toshiro Yamanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 11 days.

(21) Appl. No.: 13/727,710

(22) Filed: Dec. 27, 2012

(65) Prior Publication Data

US 2013/0164684 A1 Jun. 27, 2013

(30) Foreign Application Priority Data

Dec. 27, 2011 (JP) ................... 2011-286221

(51) Int. Cl.
*H01J 3/07* (2006.01)
*H01J 37/147* (2006.01)
*H01J 3/26* (2006.01)

(52) U.S. Cl.
USPC .............. 250/396 R; 250/492.2; 250/492.3; 250/492.22; 250/396; 430/296; 430/942

(58) Field of Classification Search
USPC ......... 250/396 R, 492.2, 492.3, 492, 22, 398; 430/296, 942
See application file for complete search history.

(56) References Cited

U.S. PATENT DOCUMENTS

| 7,105,842 B2* | 9/2006 | Tanimoto et al. ........ 250/492.22 |
| 8,492,732 B2* | 7/2013 | Ogasawara ............... 250/396 R |
| 2013/0344443 A1* | 12/2013 | Kawamoto et al. ........... 430/296 |

FOREIGN PATENT DOCUMENTS

| JP | 4313145 B | 5/2009 |
| JP | 4634076 B | 11/2010 |

* cited by examiner

*Primary Examiner* — Nikita Wells (74) *Attorney, Agent, or Firm* — Fitzpatrick, Cella, Harper & Scinto (57) ABSTRACT

A lithograph apparatus that performs writing on a substrate with a plurality of charged particle beams. A blanking deflector array blanks the plurality of charged particle beams. An aperture array blocks n charged particle beam deflected by the blanking deflector array. A sealing mechanism seals an opening or at least one of the blanking deflector array and the aperture array with a shielding material that shields a charged particle beam. A moving mechanism moves the substrate so that the writing is performed with a blankable charged particle beam instead of an unblankable charged particle beam shielded by the shielding material.

16 Claims, 6 Drawing Sheets

FIG. 8

CHARGED PARTICLE BEAM LITHOGRAPHY APPARATUS AND METHOD, AND ARTICLE MANUFACTURING METHOD

This application claims the benefit of Japanese Patent Application No. 2011-286221, filed Dec. 27, 2011, which is hereby incorporated by reference herein in its entirety.

BACKGROUND OF THE INVENTION

1. Field of the Invention

The present invention relates to a charged particle beam lithography apparatus and method, and an article manufacturing method.

2. Description of the Related Art

Lithography apparatuses that perform writing on a substrate by controlling deflection scanning and blanking of charged particle beams such as electron beams are known. The lithography apparatuses may be employed as one of pattern forming technologies that are an alternative to optical exposure systems to produce logic large scale integrated devices (LSI) or other highly-integrated devices having a line width of 0.1 µm or less. Among the lithography apparatuses, there is a multi beam lithography apparatus that writes a pattern in parallel with a plurality of electron beams (charged particle beams). The multi beam lithography apparatus has a number of advantages for practical applications, such as unnecessary use of a mask (original plate), which is one of factors responsible for increasing manufacturing costs, or a limited production of a wide variety of devices, because electron beams can be programmably controlled.

In order to independently control the tracks of a plurality of electron beams traveling toward a substrate, the multi beam lithography apparatus includes an electron optical system including a blanking deflector array and an aperture array (stopping aperture array). In the electron optical system, the blanking deflector array is disposed on the upstream side and the aperture array is disposed on the downstream side with respect to the direction of travel of electron beams. In particular, the blanking deflector array controls an OFF (blanking) state of writing by deflecting electron beams, and the aperture array is an electrical conductor having a plurality of apertures (openings) and physically performs shielding of the deflected electron beams. In the conventional multi beam lithography apparatus, if some portion, such as one where a beam defect occurs, of any one of the components relating to the writing ON/OFF state becomes uncontrollable after the start of operating the apparatus, a pattern cannot be written accurately. Hence, for example, it is contemplated that the blanking deflector array is replaced with a new one when a beam defect caused by the blanking deflector array occurs. However, multiple feed-power implementations need to be separated and a new failure may be induced in the course of replacement. Furthermore, it becomes difficult to replace the blanking deflector array from the viewpoint of cost and time with an increase in the number of beams for use.

In contrast, as an alternative that may provide a tentative counterpart for a beam defect (independent of replacement), Japanese Patent No. 4634076 discloses a charged particle beam exposure apparatus that compensates for electron beams in a shielded state at all times using electron beams that are controllable in a normal state. On the other hand, Japanese Patent No. 4313145 discloses a charged particle beam lithography apparatus that blocks electron beams in an unshielded state at all times by means of a shutter mechanism.

Here, according to the configuration of the charged particle beam exposure apparatus disclosed in Japanese Patent No. 4634076, with respect to electron beams in a shielded state at all times, it is possible to avoid in the stopping the apparatus, although such a configuration may have an adverse effect on throughput. On the other hand, the configuration of the charged particle beam exposure apparatus disclosed in Japanese Patent No. 4034070, with respect electron beams in an unshielded state at all times is not preferred, because the configuration of the apparatus becomes complicated due to the addition of a shutter mechanism, so that normal electron beams located around electron beams in an unshielded state at all time are also blocked. Therefore, as high density multibeam formation progresses, accompanying the recent tendency of refining a line width, countermeasures against electron beams in an unshielded state at all times (incapable of blanking) are particularly required.

SUMMARY OF THE INVENTION

The present invention provides, for example, a lithography apparatus that is advantageous for shielding of a charged particle beam that cannot be blanked.

According to an aspect of the present invention, a lithography apparatus that performs writing on a substrate with a plurality of charged particle beams includes a blanking deflector array for blanking the plurality of charged particle beams, an aperture array configured to block a charged particle beam deflected by the blanking deflector array, and a sealing mechanism configured to seal an opening of at least one of the blanking deflector array and the aperture array with a shielding material that shields a charged particle beam.

According to the present invention, for example, a lithography apparatus that is advantageous for shielding charged particle beams that cannot be blanked may be provided.

Further features of the present invention will become apparent from the following description of exemplary embodiments with reference to the attached drawings.

DESCRIPTION OF THE EMBODIMENTS

Preferred embodiments of the present invention will now be described with reference to the drawings.

First, a description will be given of a charged particle beam lithography apparatus (hereafter referred to as a "lithography apparatus"), according to one embodiment of the present invention. In particular, the lithography apparatus of the present embodiment is a lithography apparatus employing a multiple beam system, in which a plurality of electron beams (charged particle beams) is deflected (scanned) and the blanking (OFF irradiation) of electron beams is independently controlled so as to write predetermined writing data at a predetermined position on a substrate to be treated. Here, a charged particle beam is not limited to an electron beam used in the present embodiment, but may be other charged particle beams, such as an ion beam.

Figure 1:
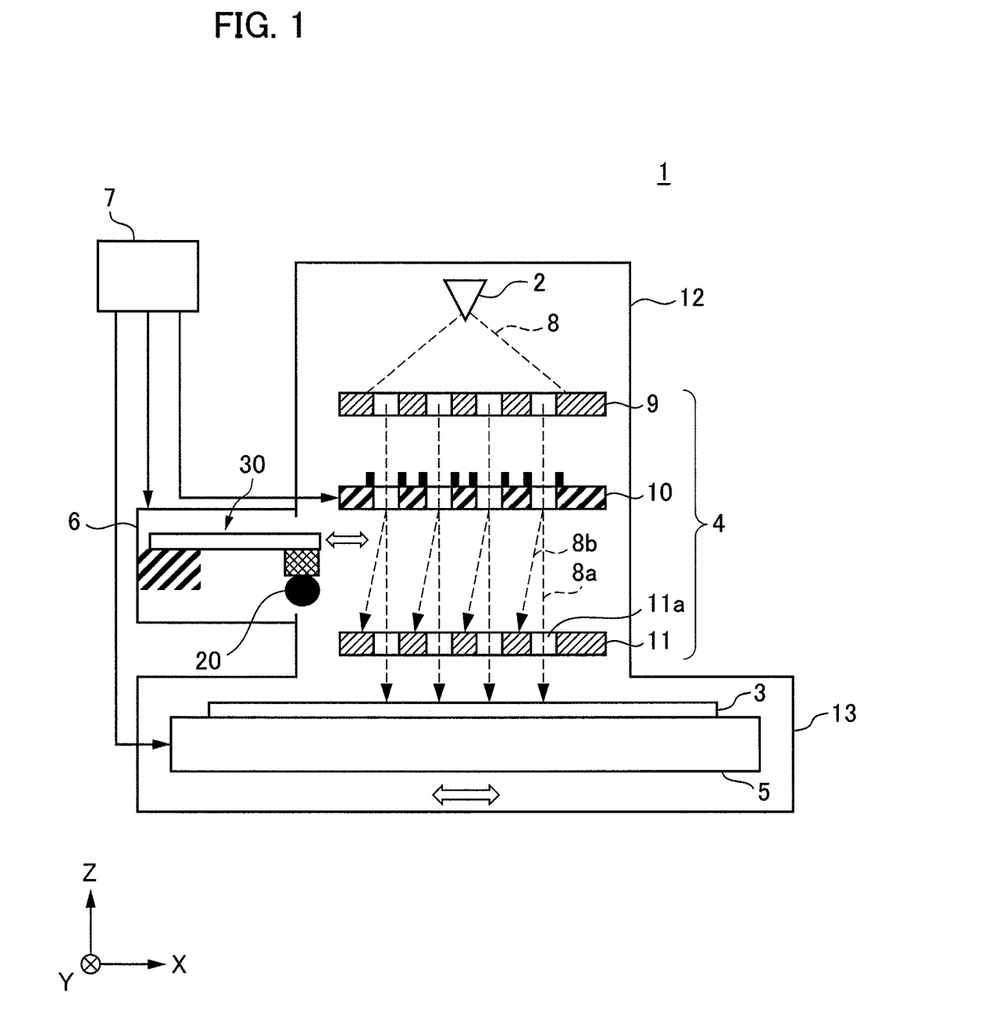
FIG. 1 is a diagram illustrating the configuration of a charged particle beam lithography apparatus according to an embodiment of the present invention.

FIG. 1 is a schematic diagram illustrating the configuration of a lithography apparatus 1 according to the present embodiment. In the following drawings, a description will be given in which the Z axis is in an irradiation direction of an electron beam to a substrate to be treated (substrate), and the X axis and the Y axis are mutually oriented in directions orthogonal to a plane perpendicular to the Z axis. The lithography apparatus 1 includes an electron source 2, an electron optical system 4, a substrate stage 5 that holds a substrate 3, a sealing mechanism 6, and a control unit 7. Also, the substrate 3 is a wafer consisting, for example, of single crystal silicon. A photosensitive resist is coated on the surface of the substrate 3.

The electron source (charged particle beam source) 2 emits an electron beam 8 by applying heat or an electrical field. Note that the electron source 2 may be a single charged particle beam source that splits the electron beam 8 incident therefrom into a plurality of electron beams by means of a divided aperture array 9 to be described below or may also include a plurality of charged particle beam sources.

The electron optical system 4 deflects and focuses the electron beam 8 that has been discharged from the electron source 2 as appropriate to thereby guide the resulting electron beam 8 onto the substrate 3. The electron optical system 4 includes three main components, i.e., a divided aperture array 9, a blanking deflector array 10, and a stopping aperture array 11. The divided aperture array 9 is an opening member having a plurality of circular openings arranged in a matrix form and splits an electron beam substantially normally incident via a collimator lens (not shown) disposed on the upstream side thereof into a plurality of electron beams 8. The blanking deflector array 10 includes a plurality of blanking deflectors arranged in a matrix form and individually performs the ON (unshielded state)/OFF (shielded state) operation of the irradiation of the electron beams 8.

The stopping aperture array (hereafter referred to as an "aperture array") 11 blocks the deflected electron beams ($8b$) and allows the non-deflected electron beams ($8a$) to pass therethrough toward the substrate 3, among the electron beams 8 that have passed through the blanking deflector and have converged by an electrostatic lens (not shown). Additionally, the electron optical system 4 may include multiple types of electrostatic lens arrays that allow the beam diameter of the electron beam 8 to converge, a deflector array that corrects the position of a desired electron beam 8 by scanning it, and the like. In the following description, the term "aperture" is defined as a generic name for openings (through-holes), through which the electron beams 8 can pass, constructed in array sections having different functions as described above. In this case, the aperture may also collectively act on a beamlet comprised of a plurality of electron beams 8 as one unit. The substrate stage (substrate holding unit) 5 is movable in the direction of at least two axes, i.e., an X axis and a Y axis while placing and holding the substrate 3 by means of, for example, electrostatic attraction. Furthermore, the electron beam 8 is readily attenuated under an atmospheric pressure atmosphere. Also, the electron beam 8 needs to be prevented from being discharged under high voltage. Thus, the components excluding the control unit 7 are installed in the interior of two vacuum vessels (a first vacuum vessel 12 and a second vacuum vessel 13), of which the internal pressure (vacuum pressure) is adjusted by a vacuum exhaust system.

The sealing mechanism 6 is connected to the first vacuum vessel 12, in which the electron optical system 4 has been installed and supplies (places) a shielding material 20 to any one of a plurality of apertures $11a$ provided in the aperture array 11 as countermeasures against an ON beam defect. Here, the term "beam defect" refers to the occurrence of a portion where the electron beam 8 becomes uncontrollable (incapable of blanking) due to, for example, a malfunction in either the blanking deflector array 10 or the aperture array 11. In particular, the term "ON beam defect" refers to a beam defect in which an electron beam 8 is in an unshielded state at all times, irrespective of the operation command to each blanking deflector, whereas the term "OFF beam defect" refers to a beam defect in which an electron beam 8 is in a shielded state at all times, irrespective of the same. Also, the shielding material 20 is an object that seals an aperture $11a$ where an ON beam defect occurs, so as not to allow the electron beam 8 to pass therethrough. Thus, the material and the size of the shielding material 20 are determined by the shape of the aperture $11a$. The details of the shielding material 20 will be described below.

Figure 2:
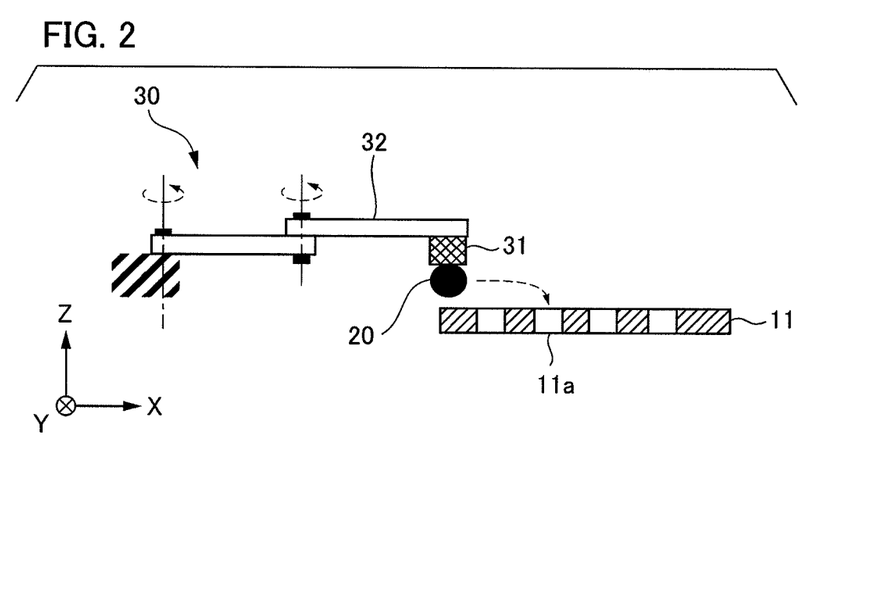
FIG. 2 is a diagram illustrating the configuration of a manipulator device serving as a sealing mechanism.

FIG. 2 is a schematic diagram illustrating the configuration of a manipulator device 30 that may be used as the sealing mechanism 6. The manipulator device 30 has an end effector 31 that holds a shielding material 20 and an arm 32 that has degree of freedom capable of positioning (conveying) the end effector 31 in the vicinity of a desired aperture $11a$ provided in the aperture array 11. Here, it is preferable that the positioning accuracy of the end effector 31 is $\frac{1}{10}$ or less of the spacing (array pitch) between a plurality of apertures $11a$ provided in the aperture array 11. For example, in the present embodiment, the array pitch is assumed to be several hundreds of μm or less. The positioning accuracy can be sufficiently positioning accuracy is tens of μm or less. The positioning accuracy can be sufficiently achieved by using the measurement values obtained by an existing position-measuring sensor such as an encoder, a laser interferometer, a laser displacement sensor, a capacitance sensor, or the like, and its feedback control.

In the manipulator device 30 shown in FIG. 2, it is assumed that the arm 32 extends from the side of the aperture array 11 toward the aperture $11a$ interest and is driven by two rotary actuators (joint with two degree of freedom). The configuration of the arm 32 is not limited thereto. The arm 32 may have a higher degree of freedom, or the degree of freedom may be provided by a linear actuator. According to the configuration, for example, the time required for changing the degree of vacuum within the electron optical system 4 upon placing the shielding material 20 and for stopping a writing processing can be minimized, which is advantageous for improvement in the apparatus operation ratio.

Figure 3A:
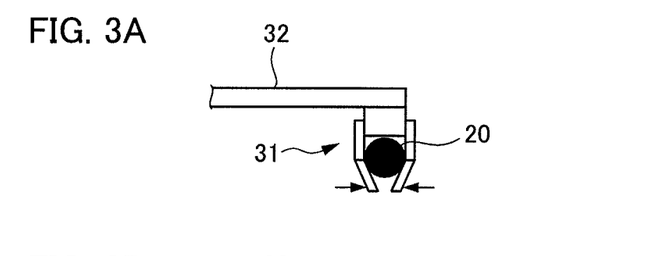
FIGS. 3A to 3C are diagrams illustrating an example of how a shielding material is held by an end effector.
Figure 3B:
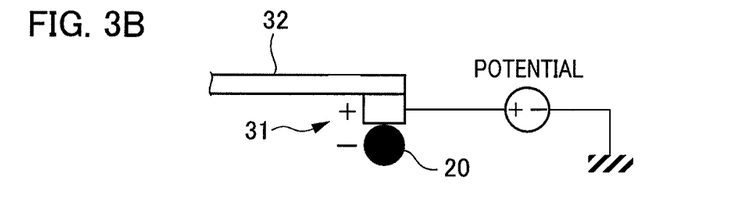
Figure 3C:
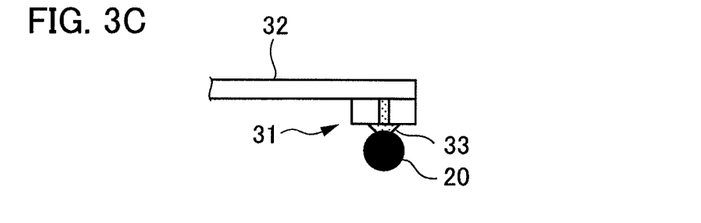

FIGS. 3A to 3C are schematic diagrams illustrating an example of how the shielding material 20 is held by the end effector 31. Since both the electron optical system 4 and the sealing mechanism 6 are installed in the vacuum space as described above, the end effector 31 may hold the shielding material 20 by at least one of a frictional force, an electrostatic force, and a capillary force, as shown in FIGS. 3A to 3C, respectively. When the end effector 31 holds the shielding material 20 by a frictional force as shown in FIG. 3A, the shielding material 20 can be placed in the aperture $11a$ by releasing the fractional force in a state where the shielding material 20 is close enough to the upper part of the target aperture $11a$ under the drive of the arm 32. Alternatively, the frictional force may be released in a state where the shielding material 20 is brought into contact with the aperture 11a. When the end effector 31 holds the shielding material 20 by an electrostatic force, as shown in FIG. 3B, the shielding material 20 can be placed by conveying the shielding material 20, while attracting it by a potential being applied and by releasing the attraction in a state where the shielding material 20 is close enough to the upper part of the aperture 11a. Furthermore, when the end effector 31 holds the shielding material 20 by a capillary force exerted by liquid 33, as shown in FIG. 3C, the shielding material 20 can be placed by separating the liquid 33 and the shielding material 20 at an interface therebetween by displacing the holding position in a state where the shielding material 20 is brought into contact with the aperture 11a. Alternatively, the shielding material 20 may be separated from the liquid 33 by heating it for vaporization. While the description of the holding systems above is given on the assumption that only one shielding material 20 is held, the end effector 31 may also be constituted to hold a plurality of shielding materials 20 at the same time.

Furthermore, the control unit 7 is constituted, for example, by a computer, or the like, and is connected to the components of the lithography apparatus 1 via a line to thereby execute control of the components in accordance with a program, or the like. The control unit 7 of the present embodiment controls at least the identification of an ON beam defect and the operation of the sealing mechanism 6 in association with its restoration. Note that the control unit 7 may be integrated with the rest of the lithography apparatus 1 (may be provided in a shared case) or may be installed at a location separate from the location where the rest of the lithography apparatus 1 is installed (may be provided in a separate case).

Next, a description will be given of the operation of the lithography apparatus 1 when a beam defect occurs. In the normal operation, the electron beam 8 that is emitted from the electron source 2 onto the substrate 3 advances directly through the blanking deflector array 10 by the OFF-control of the blanking deflector and further advances through the aperture 11a of the aperture array 11 disposed on the downstream side, to thereby reach the substrate 3. In contrast, the electron beam 8 that is emitted from the electron source 2, but does not impinge onto the substrate 3, is deflected by the ON-control of the blanking deflector and is shielded at the periphery of the aperture 11a on the aperture array 11, and thus, the electron beam 8 does not reach the substrate 3. However, a beam defect in which the ON/OFF control of an electron beam 8 cannot be performed occurs due to a malfunction as described above, and thus, the countermeasures against an ON beam defect in an unshielded state at all times are particularly required. Accordingly, the lithography apparatus 1 of the present embodiment performs the following process.

Figure 4:
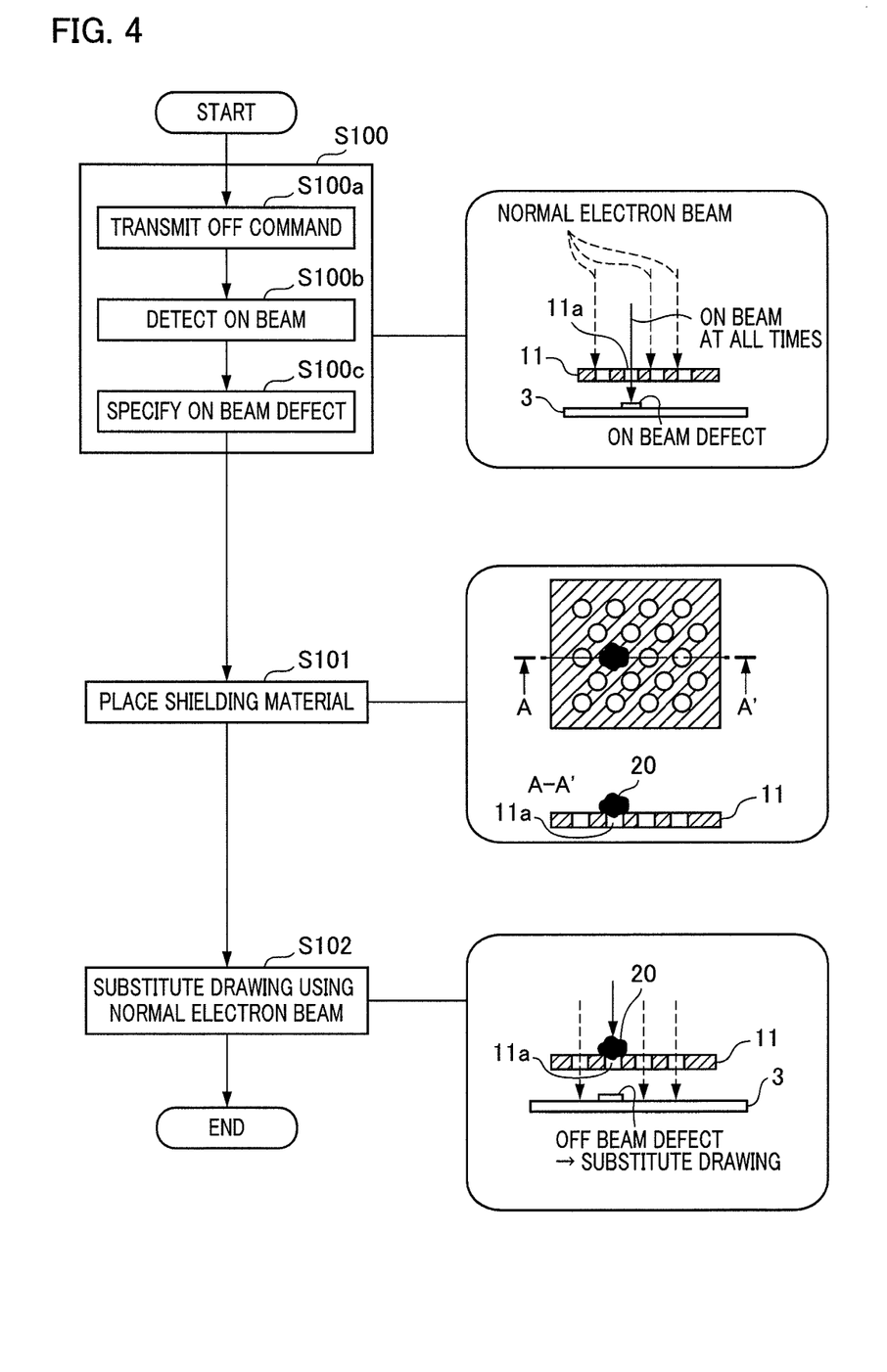
FIG. 4 is a flowchart illustrating the flow of the restoration of a beam defect together with illustrative diagrams.

FIG. 4 is a flowchart illustrating the flow of the restoration of a beam defect by the lithography apparatus 1 together with illustrative diagrams. First, when an ON beam defect occurs, the control unit 7 specifies which aperture 11a provided in the aperture array 11 corresponds to a defect generating place (defect section specifying step; step S100). As a specification method used herein, the control unit 7 first transmits an irradiation OFF command to all the blanking deflectors provided in the blanking deflector array 10 in a state when the electron beam 8 is emitted from the electron source 2 (step S100a). At this time, since all the blanking deflectors have received the OFF command, none of the electron beams 8 is irradiated onto the writing surface (onto the substrate 3) under the normal operation (become OFF beams 8b as shown in FIG. 1). In contrast, if an electron beam 8 is detected on the writing surface (step S100b), the control unit 7 can specify the fact that the ON beam defect occurs at the location corresponding thereto (step S100c). Here, when the control unit 7 specifies the location at which the ON beam defect occurs, the process shifts to the next step S101. Note that a determination as to whether an ON beam defect occurs by means of the control unit 7 may be made by performing the above steps separately from the normal writing processing or a determination as to whether an ON beam defect occurs may be made at all times together with the normal writing processing for the substrate 3.

Figure 5:
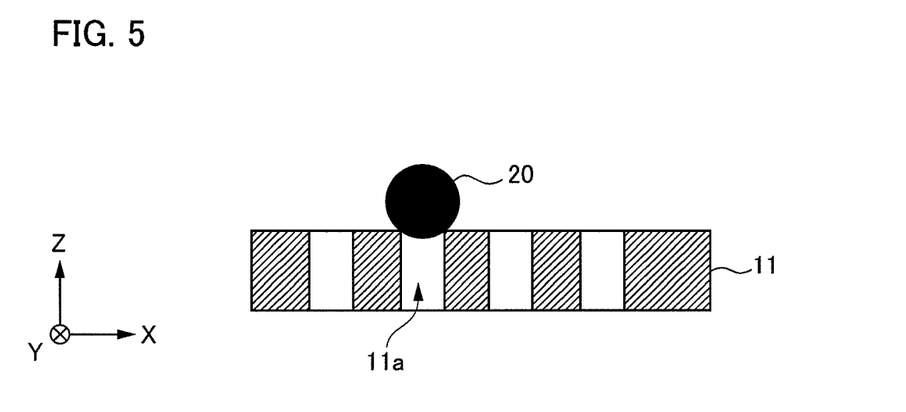
FIG. 5 is a diagram illustrating the nominal external shape of a shielding material.
Figure 6A:
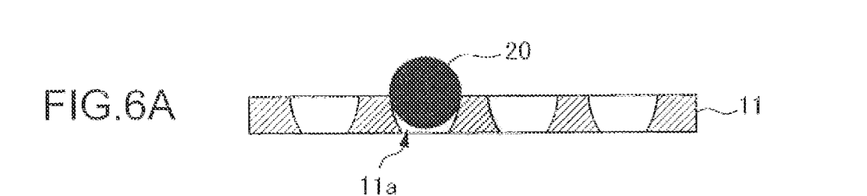
FIGS. 6A to 6E are diagrams illustrating examples of the shape of an aperture sealing region.
Figure 6B:
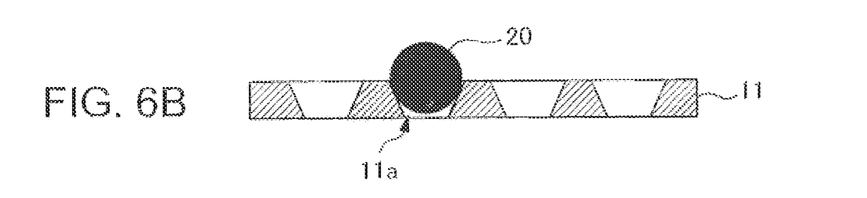
Figure 6C:
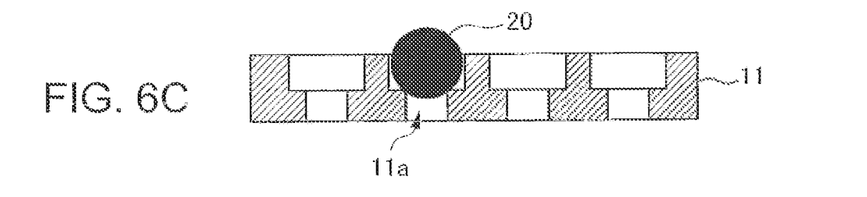
Figure 6D:
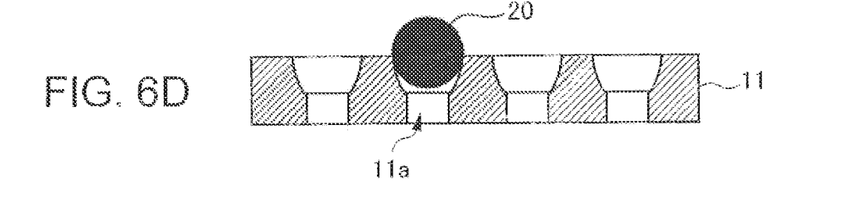
Figure 6E:
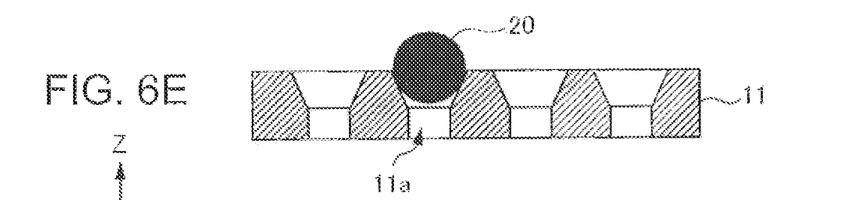

Next, the control unit 7 causes the sealing mechanism 6 to place the shielding material 20 on the aperture 11a corresponding to the location where the ON beam defect specified in step S100 occurs (step S101). Here, it is preferable that the shielding material 20 absorbs electrons (charged particles) on the surface or the inside thereof. For example, if electrons are accumulated in the shielding material 20, the electrical field formed by the electrons may have an adverse effect on the optical characteristics of the adjacent electron beams 8. Thus, it is preferable that the material of the shielding material 20 has conductivity so as to readily release electrons to the outside, without electrons accumulating therein. As an example of the material of the shielding material 20, molybdenum, which includes a high meting point metal and is also typically used as the material of the aperture array 11, is preferred. Alternatively, the shielding material 20 may be an object composed of a plurality of materials or an object in which a conductive material is coated on the surface of an insulation material. The shape of the aperture 11a on which the shielding material 20 is placed should be determined by an electron optical design. However, when the opening size of the aperture 11a becomes smaller, the size of the corresponding shielding material 20 also becomes smaller. Consequently, the dimensional tolerance of the nominal shape of the shielding material 20 becomes demanding. Thus, in order to retain the ease of placement of the shielding material 20 onto the aperture 11a and a contact between the shielding material 20 and the aperture 11a, irrespective of the dimensional tolerance between any shape of the aperture 11a and the external shape of the shielding material 20, it is preferable that the nominal external shape of the shielding material 20 is spherical (generally, spherical), as shown in FIG. 5. Furthermore, when a margin is available with respect to the opening size of the aperture 11a, in terms of the electron optical design, it is preferable that the upper inner diameter of the aperture 11a is greater than the lower inner diameter thereof, based on the assumption that the electron beam 8 is passes through in the vertical lower direction. With this arrangement, there can be improvement in the ease of placement of the shielding material 20 and position stability after placement.

FIGS. 6A to 6E are schematic cross-sectional views illustrating examples of the shape (aperture pit shape) of the aperture sealing region (shielding material placing region) of the aperture 11a in the aperture array 11. As shown in FIGS. 6A to 6E, the side surface of the aperture 11a may have a curved shape, a tapered shape, a step-difference shape, or a combination thereof. A method of forming the aperture 11a into such a shape is not particularly limited in the present invention, and such a shape can be produced by an anisotropic etching of, for example, a single crystal silicon substrate or an SOI (Silicon on Insulator) substrate. On the other hand, although the opening size of the aperture 11a is not limited, as described above, the opening size may entail to be several hundreds of μm or less for the realization of high density multi-beam formation or may need to be tens of μm or less for obtaining a high resolution. Thus, when the opening size of the aperture 11a is small, a second shielding material 21 composed of liquid may also be employed instead of the shielding material 20.

Figure 7:
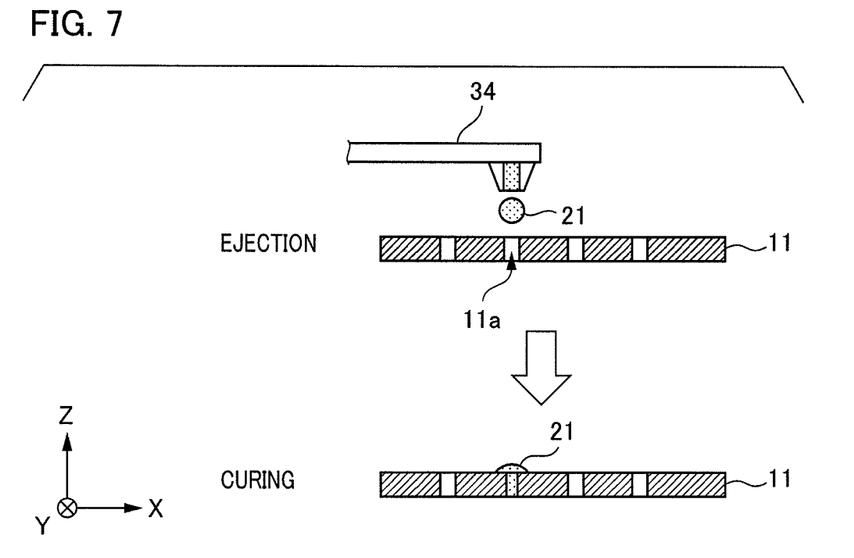
FIG. 7 is a diagram illustrating a second shielding material composed of liquid and the state of the dropped liquid.

FIG. 7 is a schematic diagram illustrating the second shielding material 21 and the state of the dropped liquid. As shown in FIG. 7, the shielding of the aperture 11a may be realized by dropping a droplet of liquid (for example, adhesive) serving as the second shielding material 21, on the target aperture 11a, from an application mechanism (droplet ejection nozzle) 34, and curing the droplet. The liquid can be dropped by an existing inkjet apparatus, or the like.

Figure 8:
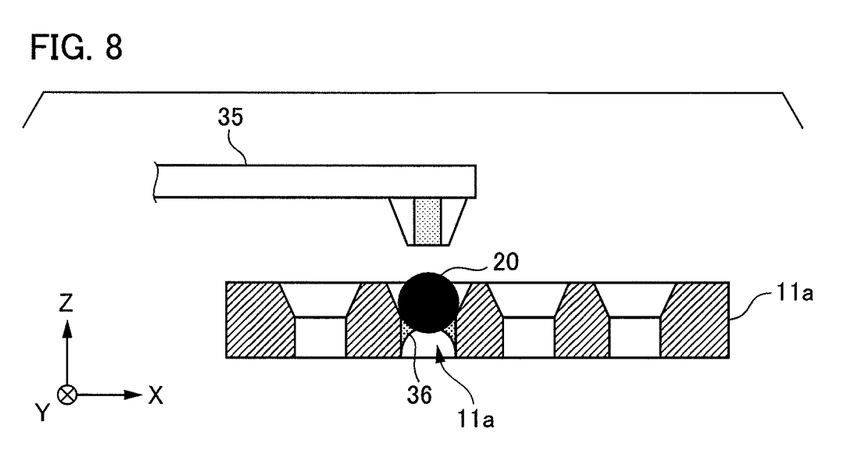
FIG. 8 is a diagram illustrating the state in which an adhesive for fixing a shielding material is applied.

Heretofore, a description has been given of the placement of the shielding material 20, but it is preferable that the shielding material 20 is fixed to the aperture 11a, so as to ensure the electrical contact, heat contact, or positional stability between the shielding material 20 and the aperture 11a after placement of the shielding material 20 onto the aperture 11a. An exemplary fixation method includes a method of applying an adhesive 36 to the surface of the shielding material 20 or the edge of the aperture 11a or which the shielding material 20 is desired to be placed in advance by means of an application mechanism 35 constituting the sealing mechanism 6 prior to placement of the shielding material 20, as shown in FIG. 8, and curing the adhesive 36 after placement. A preferred example of the adhesive 36 to be used at this time includes an epoxy adhesive containing silver. On the other hand, as another method of fixing the shielding material 20, the target aperture 11a may also be shielded by heating and melting (i.e., reflowing) the placed shielding material 20 by means of the heating mechanism constituting the sealing mechanism 6. For example, in general, there is a method of arranging a ball grid array on the bottom surface of an electronic device and feeding power to the ball grid array using a flip-chip bonding process. A solder ball having a diameter of several hundreds of μm or less for use in the method can be sufficiently employed as the shielding material 20. At this time, the solder ball serving as the shielding material 20 can be heated by using the electron beam 8 with increasing irradiation energy or by providing a mechanism for directly heating the aperture 11a. For an aperture that is provided in an electrostatic lens array, or the like, constituting the electron optical system 4 and to which a high voltage with an absolute value of several kV or greater, a low melting point material, such as solder, may induce discharges, and thus, the countermeasures against discharges are needed.

After completion of step S101, the aperture 11a restored by the sealing mechanism 6 is in a shielded state at all times. Thus, for the region to be originally written through the aperture 11a, the control unit 7 interlocks the movement of the substrate stage 5 with the control of another electron beam 8 in a normal operation, to thereby carry out substitute writing (step S102). The state occurring in the aperture 11a is the same as that when an OFF beam defect occurs. In other words, while the above description has been given of the countermeasures against an ON beam defect, the control unit 7 may execute processing in step S102 if an OFF beam defect occurs from the beginning.

As described above, if an ON beam defect particularly occurs, the lithography apparatus 1 can restore only a portion corresponding to the beam defect by means of a simple mechanism in a short period of time. Furthermore, the method using a shielding material as described above does not restrict the shape and the size of the aperture 11a on which the shielding material is to be placed, resulting in an excellent adaptability to an apparatus. In the above description, the aperture array 11 is targeted for restoration by means of the shielding material 20. this is because the aperture array 11 is best suited for restoration, since it has apertures and has a simple junction mechanism among the array sections constituting the electron optical system 4. If should be noted that the target to be restored by the shielding material 20 is not limited to the aperture 11a provided in the aperture array 11, but may be another aperture provided in another array section.

As described above, the present embodiment provides a lithography apparatus 1 that is advantageous for shielding, for example, an electron beam 8 that cannot be blanked.

Restoration by means of the lithography apparatus 1 is preferred from the viewpoint of minimizing the shutdown time for the apparatus upon restoration. For example, the following method may also be employed from the viewpoint of ease of restoration. First, the first method is a method in which the aperture array 11 is temporarily conveyed to the exterior of the lithography apparatus 1, and then, the shielding material 10 is placed on the specific aperture 11a using a dedicated device upon restoration of an ON beam defect. The second method is a method in which an aperture array equivalent to the aperture array 11, in which the shielding material 20 has already been placed on a specific aperture 11a, prepares, so as to replace it with the aperture array 11 currently installed in the lithography apparatus 1. According to these methods, it is time-consuming to temporarily take out the aperture array 11 from the interior of the lithography apparatus 1, but the ease of restoration after the aperture array 11 has been taken out can be improved more so than before.

(Device Manufacturing Method)

An article manufacturing method according to an embodiment of the present invention is preferred in manufacturing an article, for example, a micro device, such as a semiconductor device, or the like, or an article, such as an (optical) element, or the like, having a microstructure. The article manufacturing method may include a step of forming a latent image pattern on a substrate, on which a photosensitive material is coated, using the aforementioned lithography apparatus (a step of writing a pattern on a substrate), and a step of developing the substrate on which the latent image pattern has been formed in the previous step. Furthermore, the article manufacturing method may include another known step (e.g., oxidizing, film forming, vapor depositing, doping, flattening, etching, resist peeling, dicing, bonding, packaging, and the like). The article manufacturing method of the present embodiment has an advantage, as compared with a conventional article manufacturing method, in at least one of performance, quality, productivity, and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A lithography apparatus that performs writing on a substrate with a plurality of charged particle beams, the apparatus comprising:
   a blanking deflector array for blanking the plurality of charged particle beams;
   an aperture array configured to block a charged particle beam deflected by the blanking deflector array;
   a sealing mechanism configured to seal an opening of at least one of the blanking deflector array and the aperture array with a shielding material that shield is a charged particle beam; and
   a moving mechanism for moving the substrate so that the writing is performed with a blankable charged particle beam instead of an unblankable charged particle beam shielded by the shielding material.

2. The lithography apparatus according to claim 1, further comprising;
a movable substrate holder configured to hold the substrate; and
a controller configured to control an operation of the sealing mechanism so that the sealing mechanism seals the opening corresponding to the unblankable charged particle beam with the shielding material, and to control a drive of the substrate holder so that the writing is performed with a blankable charged particle beam instead of the unblankable charged particle beam shielded by the shielding material.

3. The lithography apparatus according to claim 1, wherein the shielding material is a spherical object.

4. The lithography apparatus according to claim 1, wherein the shielding material is an adhesive.

5. The lithography apparatus according to claim 1, wherein the sealing mechanism comprises a manipulator.

6. The lithography apparatus according to claim 5, wherein the manipulator includes an end effector configured to hold the shielding material by at least one of a frictional force, an electrostatic force, and a capillary force.

7. The lithography apparatus according to claim 1, wherein the sealing mechanism is configured to seal the opening vial adhering of the shielding material with an adhesive.

8. The lithography apparatus according to claim 1, wherein the sealing mechanism is configured to seal the opening via melting of the shielding material.

9. The lithography apparatus according to claim 1, wherein the opening is configured so that a charged particle beam passes through in a vertically downward direction, and an upper inner diameter thereof is greater than a lower inner diameter thereof, and
wherein the sealing mechanism is configured to place the shielding material at the opening from above the opening.

10. A writing method of performing writing on a substrate with a plurality of charged particle beams, the method comprising:
sealing an opening, corresponding to an unblankable charged particle beam, of at least one of a blanking deflector array for blanking the plurality of charged particle beams and an aperture array configured to block a charged particle beam deflected by the blanking deflector array with a shielding material that shields a charged particle beam; and
moving the substrate so that the writing is performed with a blankable charged particle beam instead of the unblankable charged particle beam shielded by the shielding material.

11. A method of manufacturing an article, the method comprising:
(a) performing writing on a substrate with a lithography apparatus; and
(b) developing the substrate, on which the writing has been performed, to manufacture the article,
wherein the lithography apparatus performs writing on the substrate with a plurality of charged particle beams, the apparatus including:
(i) a blanking deflector array for blanking the plurality of charged particle beams;
(ii) an aperture array configured to block a charged particle beam deflected by the blanking deflector array;
(iii) a sealing mechanism configured to seal an opening of at least one of the blanking deflector array and the aperture array with a shielding material that shields a charged particle beam; and
(iv) a moving mechanism for moving the substrate so that the writing is performed with a blankable charged particle beam instead of an unblankable charged particle beam shielded by the shielding material.

12. A method of manufacturing an article, the method comprising:
(a) performing writing on a substrate with a writing method; and
(b) developing the substrate, on which the writing has been performed, to manufacture the article,
wherein the writing method performs writing on the substrate with a plurality of charged particle beams, the writing method including:
(i) sealing an opening, corresponding to an unblankable charged particle beam, of at least one of a blanking deflector array for blanking the plurality of charged particle beams and an aperture array configured to block a charged particle beams deflected by the blanking deflector array with a shielding material that shields a charged particle beam; and
(ii) moving the substrate so that the writing is performed with a blankable charged particle beam instead of the unblankable charged particle beam shielded by the shielding material.

13. A lithography apparatus that performs writing on a substrate with a plurality of charged particle beams, the apparatus comprising:
a blanking array for blanking the plurality of charged particle beam;
a sealing mechanism configured to seal an opening of the blanking array with a shielding material that shields a charged particle beam; and
a moving mechanism for moving the substrate so that the writing as performed with a blankable charged particle beam instead of an unblankable charged particle beam shielded by the shielding material.

14. A writing method of performing writing on a substrate with a plurality of charged particle beams, the method comprising:
sealing an opening, corresponding to an unblankable charged particle beam, of a blanking array for blanking the plurality of charged particle beams with a shielding material that shields a charged particle beam; and
moving the substrate so that the writing is performed with a blankable charged particle beam instead of the unblankable charged particle beam shielded by the shielding material.

15. A method of manufacturing an article, the method comprising:
(a) performing writing on a substrate with a lithography apparatus; and
(b) developing the substrate, on which the writing has been performed, to manufacture the article,
wherein the lithography apparatus performs writing on the substrate with a plurality of charged particle beams, the apparatus including:
(i) a blanking array for blanking the plurality of charged particle beams;
(ii) a sealing mechanism configured to seal an opening of the blanking array with a shielding material that shields a charged particle beam; and
(iii) a moving mechanism for moving the substrate so that the writing is performed with a blankable charged particle beam instead of an unblankable charged particle beam shielded by the shielding material.

16. A method of manufacturing an article, the method comprising:
(a) performing writing on a substrate with a writing method; and
(b) developing the substrate, on which the writing has been performed, to manufacture the article,
wherein the writing method performs writing on the substrate with a plurality of charged particle beams, the writing method including:
(i) sealing an opening, corresponding to an unblankable charged particle beam, of a blanking array for blanking the plurality of charged particle beams with a shielding material that shields a charged particle beam; and
(ii) moving the substrate so that the writing is performed with a blankable charged particle beam instead of the unblankable charged particle beam shielded by the shielding material.

* * * * *